US006947268B2

(12) United States Patent
Hisaka

(10) Patent No.: US 6,947,268 B2
(45) Date of Patent: Sep. 20, 2005

(54) ESD-PROTECTING CIRCUIT AND LSI USING THE SAME

(75) Inventor: Katsuhiro Hisaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 100 days.

(21) Appl. No.: 10/062,453

(22) Filed: Feb. 5, 2002

(65) Prior Publication Data

US 2003/0147188 A1 Aug. 7, 2003

(51) Int. Cl.[7] .............................. H02H 3/20; H02H 9/04
(52) U.S. Cl. ........................................ 361/56; 361/91.1
(58) Field of Search .......................... 361/56, 111, 91.1; 257/360, 358, 356, 538, 536

(56) References Cited

U.S. PATENT DOCUMENTS

| | | | | |
|---|---|---|---|---|
| 5,248,892 A | * | 9/1993 | Van Roozendaal et al. | 257/357 |
| 5,404,041 A | * | 4/1995 | Diaz et al. | 257/360 |
| 5,468,984 A | * | 11/1995 | Efand et al. | 257/356 |
| 5,594,611 A | * | 1/1997 | Consiglio et al. | 361/118 |
| 5,640,299 A | * | 6/1997 | Leach | 361/56 |
| 5,763,919 A | * | 6/1998 | Lin | 257/360 |
| 5,854,504 A | * | 12/1998 | Consiglio | 257/358 |
| 5,859,456 A | * | 1/1999 | Efand et al. | 257/315 |
| 5,917,220 A | * | 6/1999 | Waggoner | 257/360 |
| 6,362,497 B1 | * | 3/2002 | Hiraga | 257/203 |
| 6,587,320 B1 | * | 7/2003 | Russ et al. | 361/56 |

OTHER PUBLICATIONS

S. Wolf, 1990, Silicon Processing for VLSI ERA, v.2, Process Integration, Lattice Press, pp. 180–187.*

* cited by examiner

Primary Examiner—Stephen W. Jackson
Assistant Examiner—Zeev Kitov
(74) Attorney, Agent, or Firm—Volentine Francos & Whitt, PLLC

(57) ABSTRACT

An ESD-protecting circuit is connected between a terminal pad and an internal circuit formed in an LSI. The ESD-protecting circuit includes a conductive line connected to the terminal pad; first and second protecting elements, connected to the conductive line; and first and second resistive elements formed on the. The conductive line has a slit that divides the conductive line so that the first and second resistive elements have equal resistive values.

23 Claims, 14 Drawing Sheets

ESD-PROTECTING CIRCUIT AND LSI USING THE SAME

TECHNICAL FIELD OF THE INVENTION

This invention relates generally to an ESD-protecting circuit for protecting an LSI from electrostatic discharge.

BACKGROUND OF THE INVENTION

Recently, an ESD-protecting circuit is used for protecting an internal circuit from electrostatic discharge in an LSI. A conventional ESD-protecting circuit includes a plurality of protecting elements, such as transistors, to draw surge current thereto. However, surge current tends to flow to the transistors unequally, and as a result, the ESD-protecting circuit and/or the internal circuit are damaged.

OBJECTS OF THE INVENTION

Accordingly, an object of the present invention is to provide an improved ESD-protecting circuit, all the protecting elements are used efficiently or in good balance.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, an ESD-protecting circuit is connected between a terminal pad and an internal circuit formed in an LSI. The ESD-protecting circuit includes first and second conductive lines, connected in parallel to the terminal pad; first and second protecting elements, connected to the first and second conductive lines, respectively; and first and second resistive elements formed on the first and second conductive lines, respectively.

According to a second aspect of the present invention, an LSI includes an I/O terminal pad connected to an external circuit; an internal circuit, comprising an I/O buffer; and an ESD-protecting circuit, connected between the I/O terminal pad and I/O buffer. The ESD-protecting circuit includes first and second conductive lines, connected in parallel to the terminal pad; first and second protecting elements, connected to the first and second conductive lines, respectively; and first and second resistive elements formed on the first and second conductive lines, respectively.

According to a third aspect of the present invention, an LSI includes a power-supply terminal; a ground terminal; a power-supply line connected between the power-supply terminal and ground terminal; an internal circuit, connected to the power-supply line; and an ESD-protecting circuit connected on the power-supply line. The ESD-protecting circuit includes first and second conductive lines, connected in parallel to the terminal pad; first and second protecting elements, connected to the first and second conductive lines, respectively; and first and second resistive elements formed on the first and second conductive lines, respectively.

According to a fourth aspect of the present invention is formed by combining the above described second and third aspects. Namely an LSI includes an I/O terminal pad connected to an external circuit; a power-supply terminal; a ground terminal; a power-supply line connected between the power-supply terminal and ground terminal; an internal circuit, which comprises an I/O buffer and is connected to the power-supply line; a first ESD-protecting circuit, connected between the I/O terminal pad and I/O buffer; and a second ESD-protecting circuit connected on the power-supply line. Each of the first and second ESD-protecting circuit includes first and second conductive lines, connected in parallel to the terminal pad; first and second protecting elements, connected to the first and second conductive lines, respectively; and first and second resistive elements formed on the first and second conductive lines, respectively.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
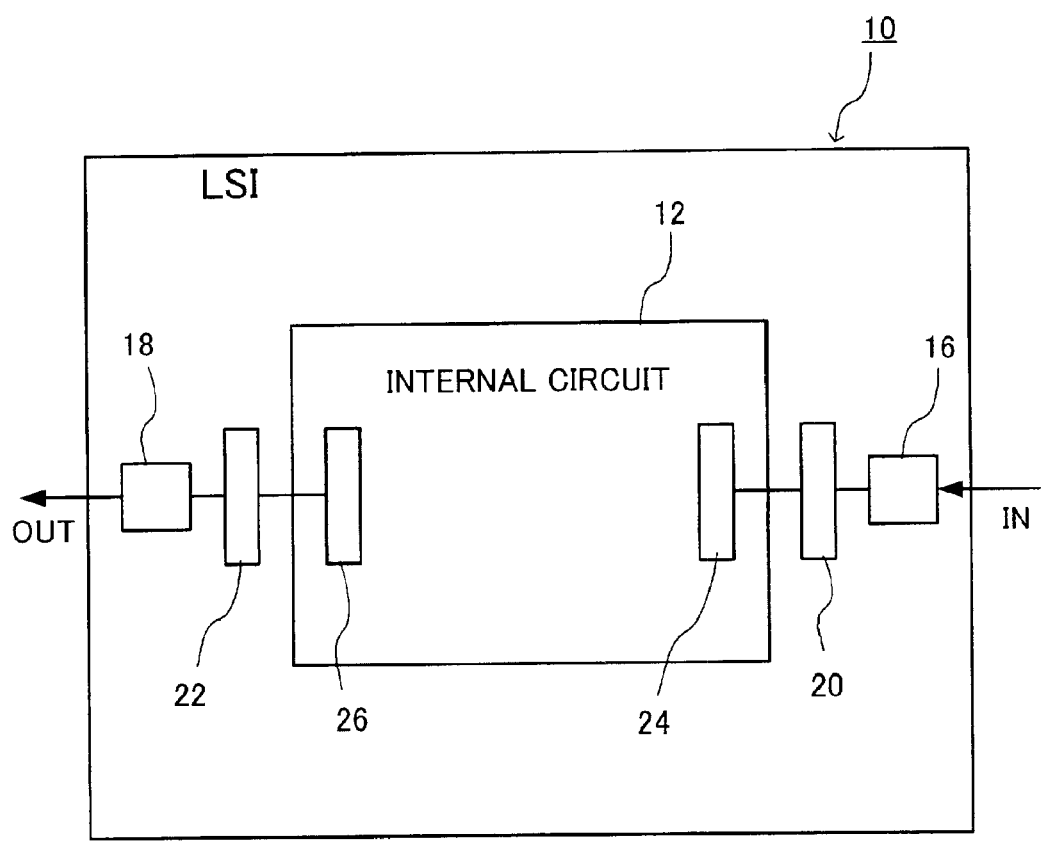
FIG. 1 is a block diagram showing an LSI according to the present invention.

FIG. 1 is a block diagram showing an LSI 10 according to the present invention. The LSI 10 includes an internal circuit 12; an I/O terminal pads 16 and 18; ESD protecting circuits 20 and 22, which are connected to the I/O terminal pads 16 and 18, respectively; and I/O buffer circuits 24 and 26, which are arranged in the internal circuit 12. The I/O buffer circuits 24 and 26 are connected to the ESD protecting circuit 20 and 22, respectively.

Figure 2:
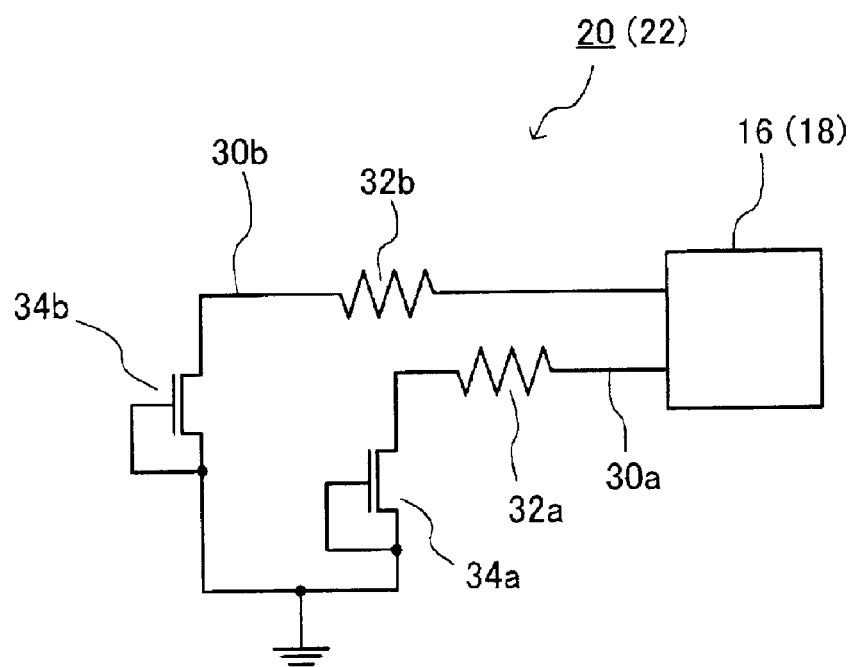
FIG. 2 is a circuit diagram showing an ESD protecting circuit according to a first preferred embodiment of the present invention.
Figure 3:
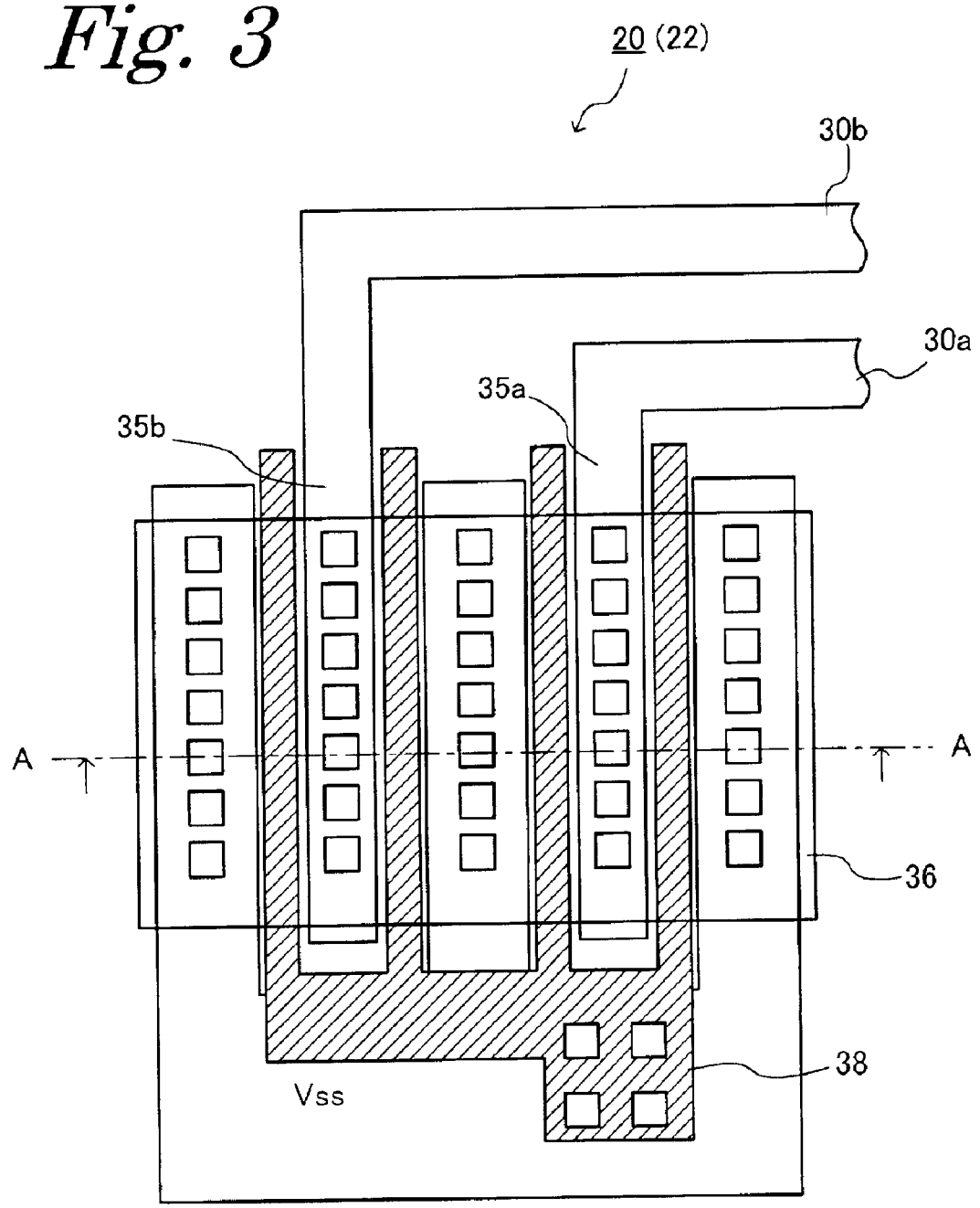
FIG. 3 is a schematic diagram showing a layout of the ESD protecting circuit, according to the first preferred embodiment.
Figure 4:
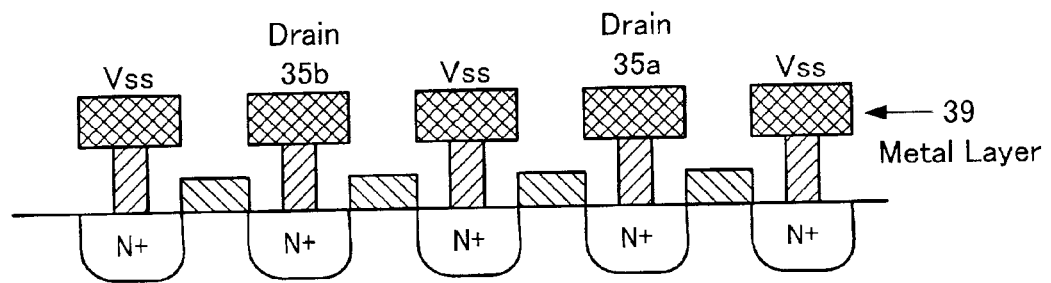
FIG. 4 is a cross sectional view taken on line A—A in FIG. 3.

FIG. 2 is a circuit diagram showing an ESD protecting circuit according to a first preferred embodiment of the present invention. FIG. 3 is a schematic diagram showing a layout of the ESD protecting circuit, according to the first preferred embodiment. FIG. 4 is a cross sectional view taken on line A—A in FIG. 3. The ESD-protecting circuits 20 and 22 have the same structure. The ESD-protecting circuit 20 (22) includes first and second conductive lines 30a and 30b, connected in parallel to the terminal pad 16 (18). The conductive lines 30a and 30b may be formed as metal patterns. The ESD-protecting circuit 20 (22) further includes first and second protecting elements 34a and 34b, connected to the first and second conductive lines 30a and 30b, respectively. The ESD-protecting circuit 20 (22) also includes first and second resistive elements 32a and 32b formed on the first and second conductive lines 30a and 30b, respectively.

The protecting elements 34a and 34b are PMOS transistors. As shown in FIG. 3, the first and second conductive lines 30a and 30b are connected to the drain 35a and 35b of the PMOS transistors 34a and 34b, respectively. In FIG. 3, reference numerals 36 and 38 represent an active region and a common gate region, respectively. The first and second protecting elements 34a and 34b are formed on the same active region 36. As shown in FIG. 4, the first and second conductive lines 30a and 30b are formed in the same metal layer 39. In other words, the ESD-protecting circuit 20 (22) is of a single metal-layer type.

Resistance values of the first and second resistive elements 32a and 32b are adjusted by changing the lengths and thickness of the first and second conductive lines 30a and 30b. The resistive element 32a forms a part of the conductive line 30a, while the resistive element 32b forms a part of the conductive line 30b. The resistance values of the first and second resistive elements 32a and 32b are controlled so that impedance existing between the pad 16 and drain 35a and impedance existing between the pad 16 and drain 35b become equal to each other.

As described above, according to the first preferred embodiment, all the protecting elements 34a and 34b are used efficiently or in good balance. As a result, concentration of surge current can be prevented, and therefore, the internal circuit 12 is well protected from electrostatic discharge.

Figure 5:
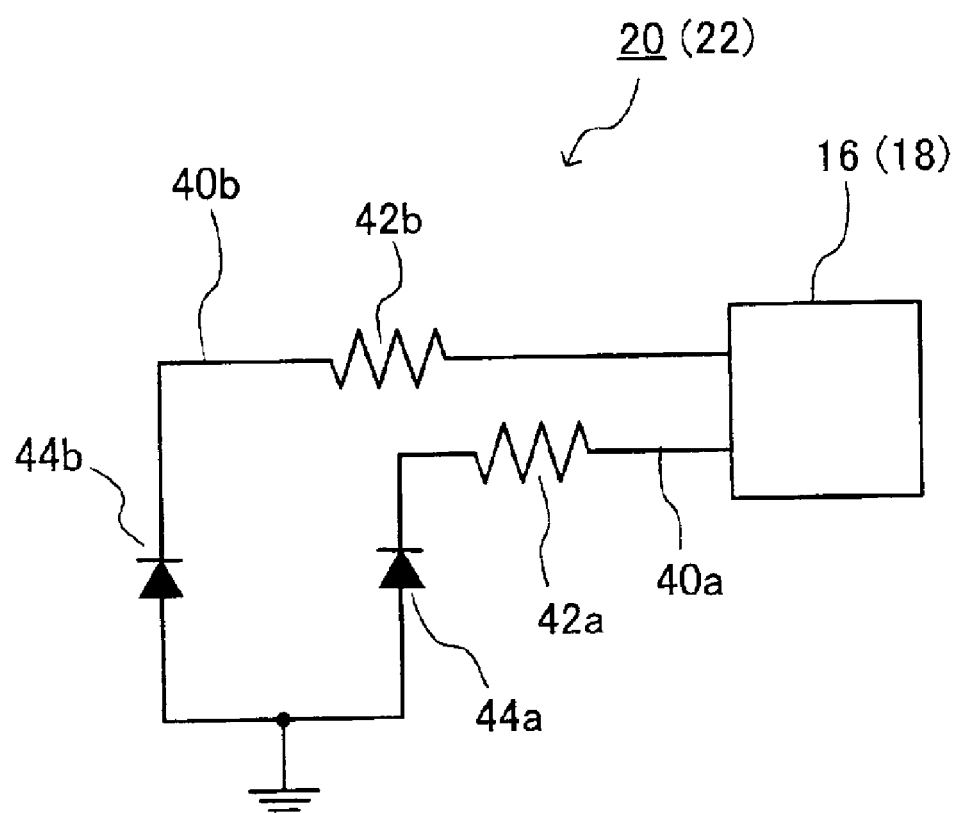
FIG. 5 is a circuit diagram showing another ESD protecting circuit according to the present invention.
Figure 6:
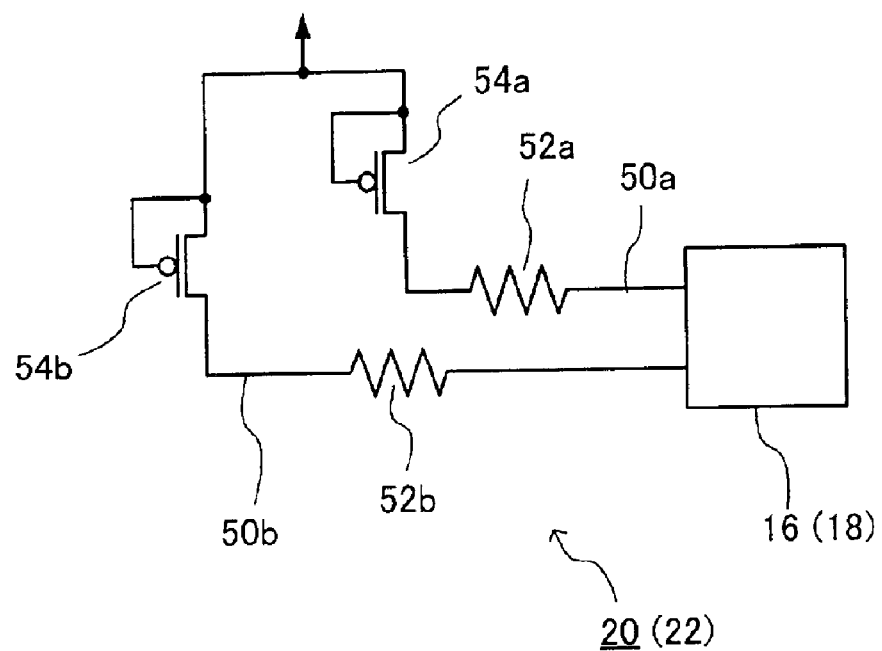
FIG. 6 is a circuit diagram showing another ESD protecting circuit according to the present invention.

FIGS. 5 and 6 are circuit diagrams showing other types of ESD protecting circuits according to the present invention. Referring to FIG. 5, the ESD-protecting circuit 20 (22) includes first and second conductive lines 40a and 40b, connected in parallel to the terminal pad 16 (18). The conductive lines 40a and 40b may be formed as metal patterns. The ESD-protecting circuit 20 (22) further includes first and second protecting elements 44a and 44b, connected to the first and second conductive lines 40a and 40b, respectively. The ESD-protecting circuit 20 (22) also includes first and second resistive elements 42a and 42b connected on the first and second conductive lines 40a and 40b, respectively. The protecting elements 44a and 44b are diodes. The first and second conductive lines 40a and 40b are formed in metal layers at a same level.

Referring to FIG. 6, the ESD-protecting circuit 20 (22) includes first and second conductive lines 50a and 50b, connected in parallel to the terminal pad 16 (18). The conductive lines 50a and 50b may be formed as metal patterns. The ESD-protecting circuit 20 (22) further includes first and second protecting elements 54a and 54b, connected to the first and second conductive lines 50a and 50b, respectively. The ESD-protecting circuit 20 (22) also includes first and second resistive elements 52a and 52b connected on the first and second conductive lines 50a and 50b, respectively. The protecting elements 54a and 54b are NMOS transistors. The first and second conductive lines 50a and 50b are formed in metal.

Figure 7:
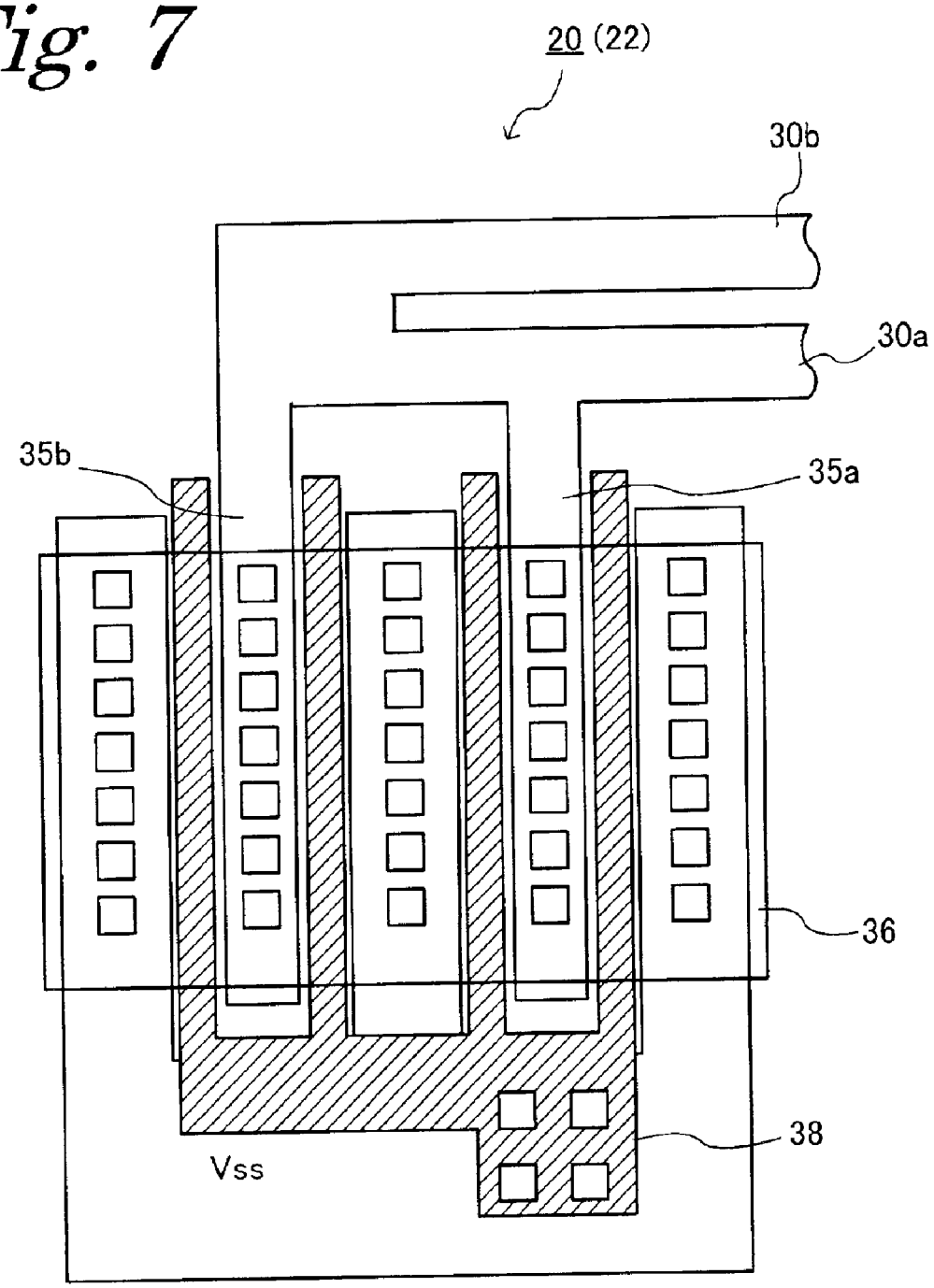
FIG. 7 is a schematic diagram showing a layout of an ESD protecting circuit according to a second preferred embodiment of the present invention.

FIG. 7 is a schematic diagram showing a layout of an ESD protecting circuit according to a second preferred embodiment of the present invention. In FIG. 7, the same or corresponding elements to those shown in FIG. 3 are represented by the same reference numerals, and the same description is not repeated. In this embodiment, first and second conductive lines 30a and 30b are formed by splitting a single conductive line at a part connected to the terminal pad 16 (18).

In the same manner as the first preferred embodiment, resistance values of the first and second conductive lines 30a and 30b are adjusted by changing the lengths and thickness thereof so that impedance existing between the pad 16 and drain 35a and impedance existing between the pad 16 and drain 35b become equal to each other.

As described above, according to the second preferred embodiment, all the protecting elements 34a and 34b are used efficiently or in good balance. As a result, concentration of surge current can be prevented, and therefore, the internal circuit 12 is well protected from electrostatic discharge.

Figure 8:
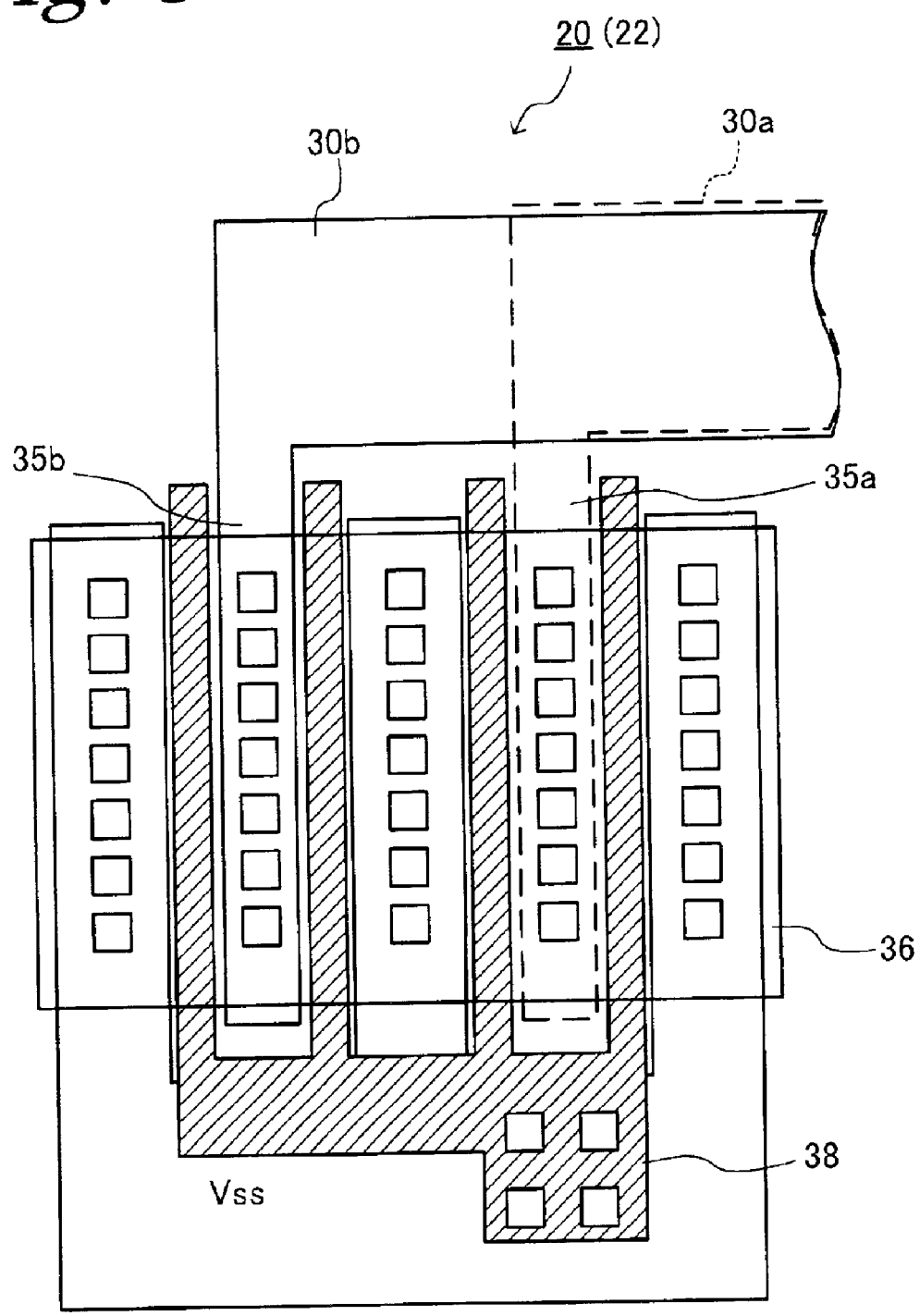
FIG. 8 is a schematic diagram showing a layout of an ESD protecting circuit according to a third preferred embodiment of the present invention.

FIG. 8 is a schematic diagram showing a layout of an ESD protecting circuit according to a third preferred embodiment of the present invention. In FIG. 8, the same or corresponding elements to those shown in FIGS. 3 and 7 are represented by the same reference numerals, and the same description is not repeated. In this embodiment, a first conductive line 30a is formed on a first conductive layer, and a second conductive line 30b is formed on a second conductive layer, which is formed above the first conductive layer.

In the same manner as the first preferred embodiment, resistance values of the first and second conductive lines 30a and 30b are adjusted by changing the lengths and thickness thereof so that impedance existing between the pad 16 and drain 35a and impedance existing between the pad 16 and drain 35b become equal to each other.

As described above, according to the third preferred embodiment, all the protecting elements 34a and 34b are used efficiently or in good balance. As a result, concentration of surge current can be prevented, and therefore, the internal circuit 12 is well protected from electrostatic discharge. In addition, the ESD-protecting circuits 20 and 22 can be designed to be smaller in size, because the first and second conductive lines 30a and 30b are formed on the different layers.

Figure 9:
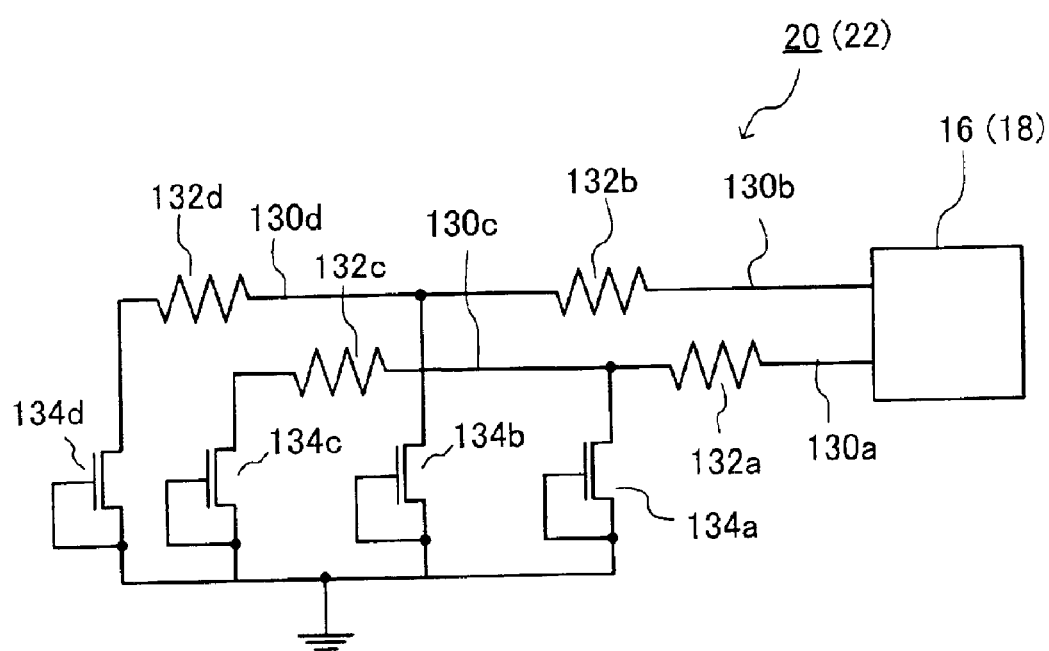
FIG. 9 is a circuit diagram showing an ESD protecting circuit according to a fourth preferred embodiment of the present invention.
Figure 10:
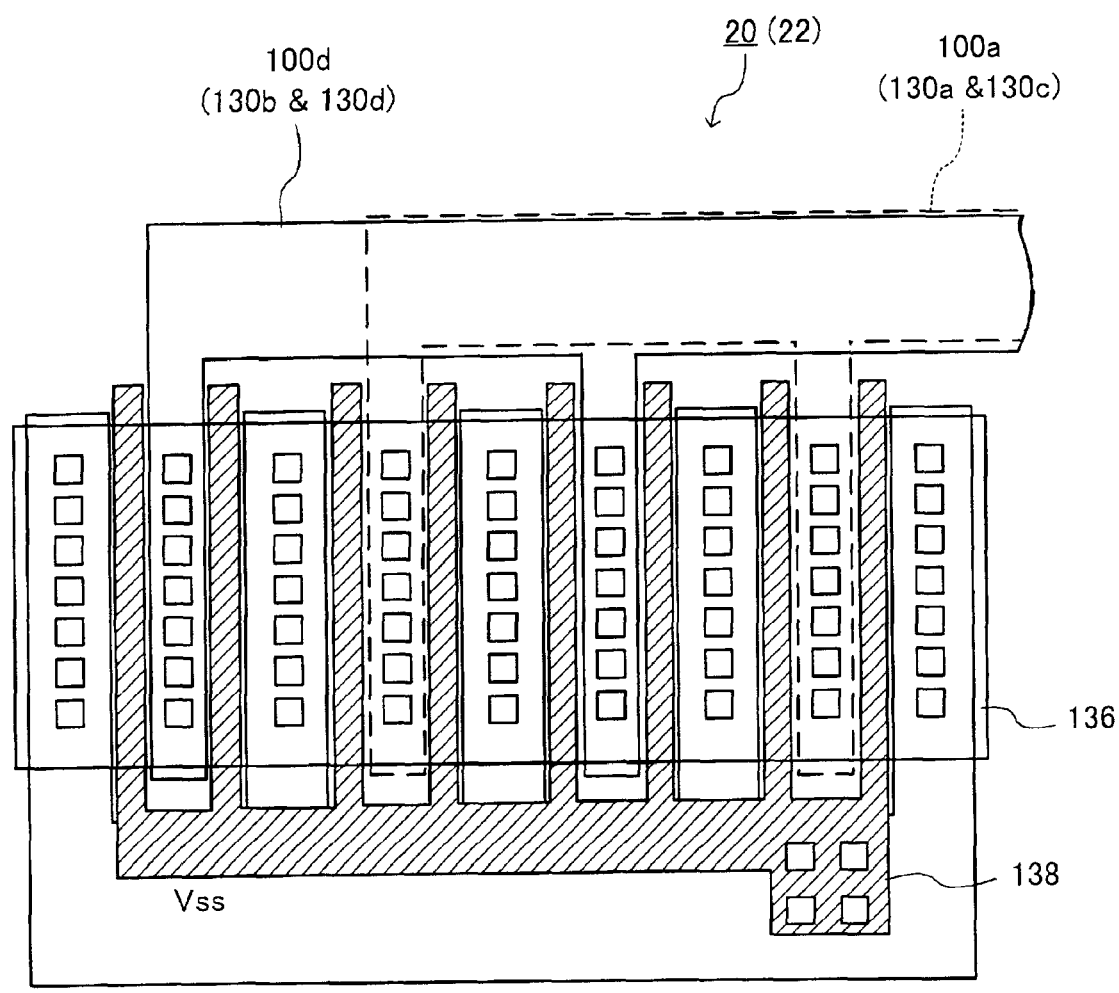
FIG. 10 is a schematic diagram showing a layout of the ESD protecting circuit, shown in FIG. 9.

FIG. 9 is a circuit diagram showing an ESD protecting circuit according to a fourth preferred embodiment of the present invention. FIG. 10 is a schematic diagram showing a layout of the ESD protecting circuit, shown in FIG. 9. In FIGS. 9 and 10, the same or corresponding elements to those shown in FIGS. 1–8 are represented by the same reference numerals, and the same description is not repeated. In this embodiment, a first conductive line 130a is formed on a first conductive layer, and a second conductive line 130b is formed on a second conductive layer, which is formed above the first conductive layer.

The ESD-protecting circuit 20 (22) further includes third and fourth conductive lines 130c and 130d, serially connected to the first and second conductive lines 130a and 130b, respectively; third and fourth protecting elements 134c and 134d, connected to the third and fourth conductive lines 130c and 130d, respectively; and third and fourth resistive elements 132c and 132d formed on the third and fourth conductive lines 130c and 130d, respectively.

The third and fourth conductive lines 130c and 130d are formed on the first and second conductive layers, respectively. In other words, the first and third conductive lines 130a and 130c form a first conductive pattern 100a on the first metal layer, while the second and fourth conductive lines 130b and 130d form a second conductive pattern 100d on the second metal layer, as shown in FIG. 10.

In the same manner as the first preferred embodiment, resistance values of the first and second conductive patterns 100a and 100d are adjusted by changing the lengths and thickness thereof so that impedance existing between the pad 16 and the drains connected to protecting elements 134a and 134c and impedance existing between the pad 16 and the drains connected to protecting elements 134b and 134d become equal to each other. As described above, according to the fourth preferred embodiment, concentration of surge current can be prevented, and therefore, the internal circuit 12 is well protected from electrostatic discharge. In addition, the ESD-protecting circuits 20 and 22 can be designed to be smaller in size, because the first and second conductive patterns 100a and 100b are formed on the different layers.

Figure 11:
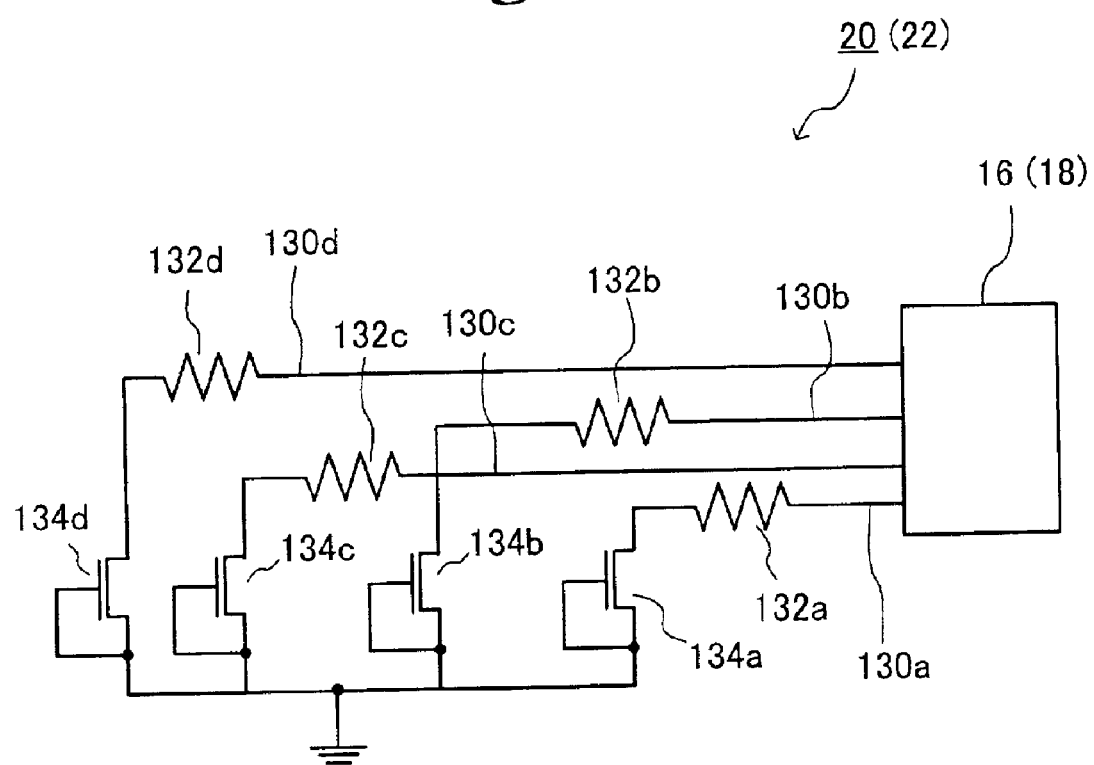
FIG. 11 is a circuit diagram showing an ESD protecting circuit according to a fifth preferred embodiment of the present invention.
Figure 12:
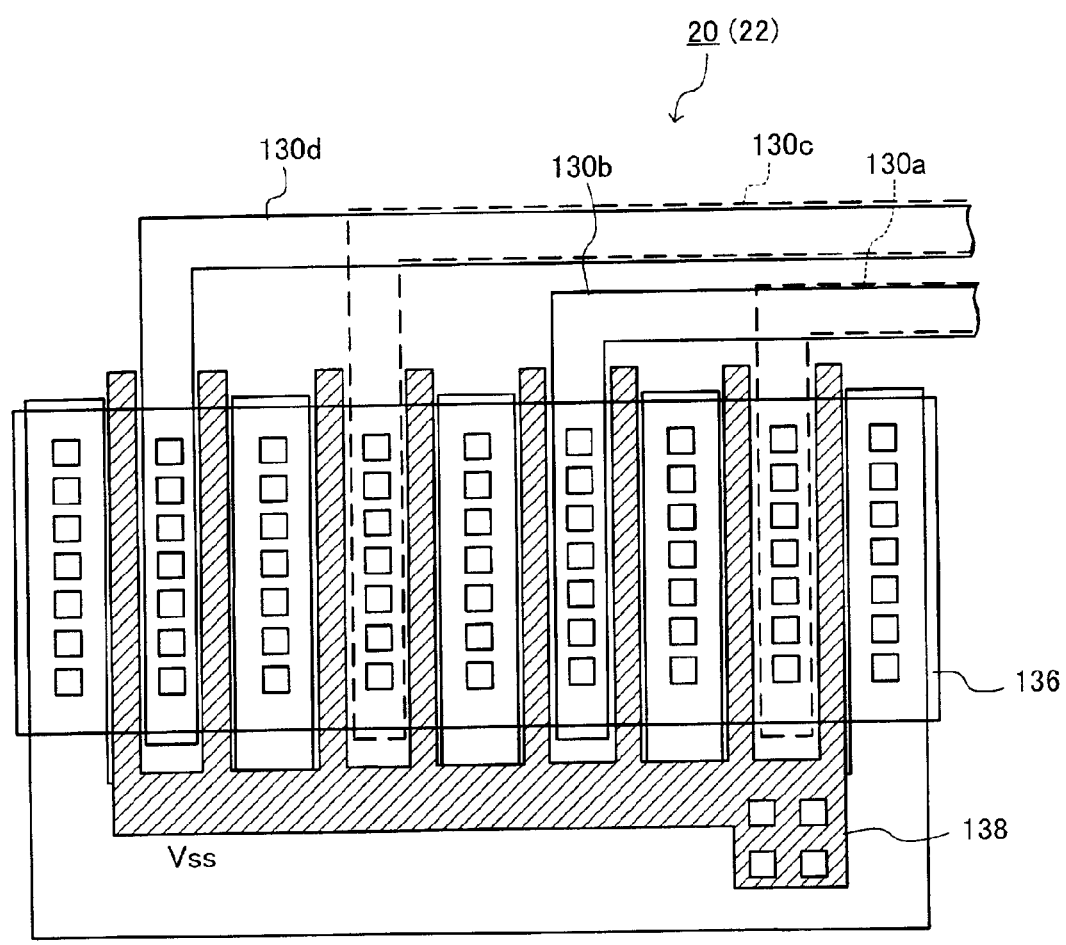
FIG. 12 is a schematic diagram showing a layout of the ESD protecting circuit, shown in FIG. 11.

FIG. 11 is a circuit diagram showing an ESD protecting circuit according to a fifth preferred embodiment of the present invention. FIG. 12 is a schematic diagram showing a layout of the ESD protecting circuit, shown in FIG. 11. In FIGS. 11 and 12, the same or corresponding elements to those shown in FIGS. 1–8 are represented by the same reference numerals, and the same description is not repeated. In this embodiment, a first conductive line 130a is formed on a first conductive layer, and a second conductive line 130b is formed on a second conductive layer, which is formed above the first conductive layer.

The ESD-protecting circuit 20 (22) further includes third and fourth conductive lines 130c and 130d, connected in parallel to a terminal pad 16 (18); third and fourth protecting elements 134c and 134d, connected to the third and fourth conductive lines 130c and 130d, respectively; and third and fourth resistive elements 132c and 132d formed on the third and fourth conductive lines 130c and 130d, respectively. The third and fourth conductive lines 130c and 130d are formed on the first and second conductive layers, respectively.

In the same manner as the first preferred embodiment, resistance values of the first to fourth conductive lines 130a, 130b, 130c and 130d are adjusted by changing the lengths and thickness thereof so that impedance existing between the pad 16 and the drains of the protecting elements become equal to each other. As described above, according to the fifth preferred embodiment, all the protecting elements 134a, 134b, 134c and 134d are used efficiently or in good balance. As a result, concentration of surge current can be prevented, and therefore, the internal circuit 12 is well protected from electrostatic discharge. In addition, the ESD-protecting circuits 20 and 22 can be designed to be smaller in size.

Figure 13:
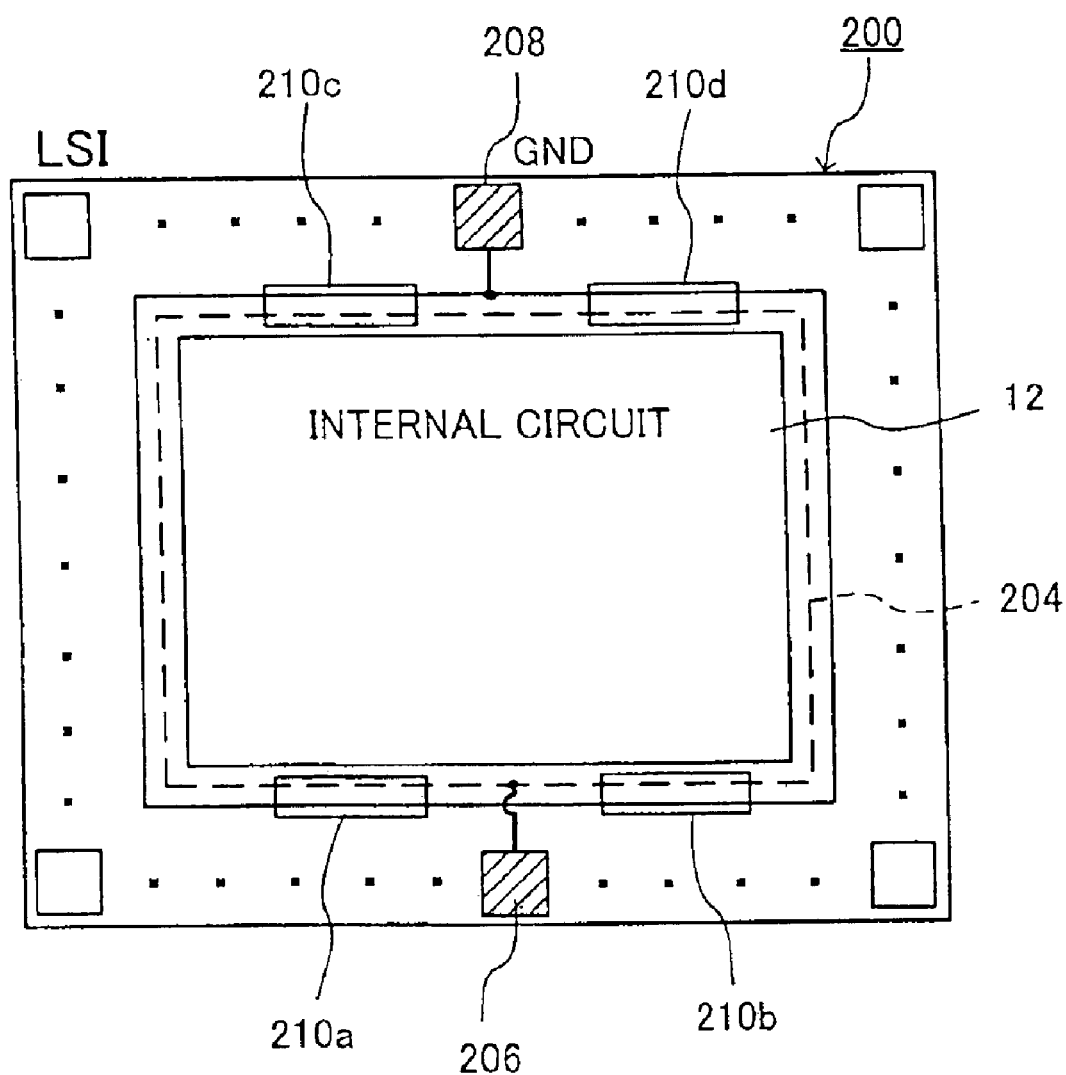
FIG. 13 is a block diagram showing another configuration of LSI according to the present invention.

FIG. 13 is a block diagram showing another configuration of LSI 200 according to the present invention. In FIG. 13, the same or corresponding elements to those shown in FIGS. 1–12 are represented by the same reference numerals, and the same description is not repeated. The LSI 200 includes a power-supply terminal 206; a ground terminal 208, which is grounded; a power-supply line 204 having supply lines respectively connected to the power-supply terminal 206 and ground terminal 208; an internal circuit 12, connected to the power-supply line 204; and first to fourth ESD-protecting circuits 210a, 210b, 210c and 210d formed on and connected to the power-supply line 204. For the first to fourth ESD-protecting circuits 210a, 210b, 210c and 210d, one of the ESD-protecting circuits described in the first to fifth preferred embodiments may be selectively used.

According to the LSI 200, shown in FIG. 13, concentration of surge current flowing through the power-supply terminal 206 and/or ground terminal 208 can be prevented, and therefore, the internal circuit 12 is well protected from electrostatic discharge.

Figure 14:
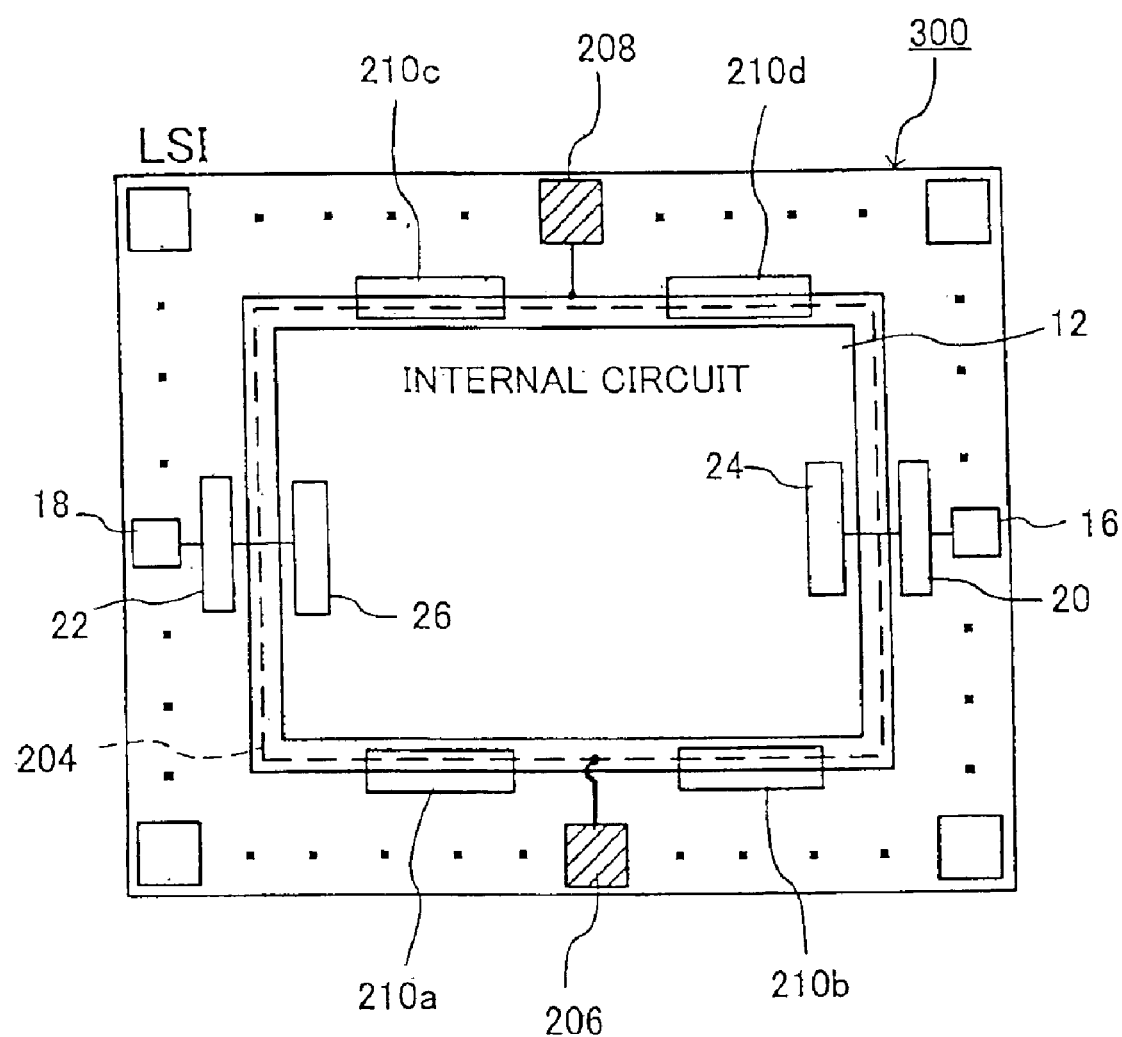
FIG. 14 is a block diagram showing another configuration of LSI according to the present invention.

FIG. 14 is a block diagram showing another configuration of LSI 300 according to the present invention. The LSI 300 can be fabricated by combining the LSIs shown in FIGS. 1 and 13. In FIG. 14, the same or corresponding elements to those shown in FIGS. 1–13 are represented by the same reference numerals, and the same description is not repeated. The LSI 300 includes a power-supply terminal 206; a ground terminal 208, which is grounded; a power-supply line 204 having supply lines respectively connected to the power-supply terminal 206 and ground terminal 208; an internal circuit 12 connected to the power-supply line 204; and first to fourth ESD-protecting circuits 210a, 210b, 210c and 210d formed on and connected to the power-supply line 204.

The LSI 300 further includes I/O terminal pads 16 and 18 connected to an external circuit. The internal circuit 12 includes I/O buffers 24 and 26. The ESD-protecting circuit 20 is connected between the I/O terminal pad 16 and the I/O buffer 24, while the ESD-protecting circuit 22 is connected between the I/O terminal pad 18 and the I/O buffer 26.

For the ESD-protecting circuits 20, 22, 210a, 210b, 210c and 210d, one of the ESD-protecting circuits described in the first to fifth preferred embodiments may be selectively used.

According to the LSI 300, shown in FIG. 14, concentration of surge current flowing through the terminal pads 16, 18, 206 and 208 can be prevented, and therefore, the internal circuit 12 is well protected from electrostatic discharge.

What is claimed is:

1. An ESD-protecting circuit, connected between a terminal pad and an internal circuit formed in an LSI, comprising:

a conductive line having a first end and a second end, the first end being connected to the terminal pad;

first and second protecting elements, connected to the second end of the conductive line; and first and second resistive elements provided in the conductive line, wherein the conductive line has a slit that divides the conductive line so that the first and second resistive elements have equal resistive values.

2. An ESD-protecting circuit according to claim 1, wherein the first and second protecting elements are MOS transistors.

3. An ESD-protecting circuit according to claim 1, wherein the first and second protecting elements are diodes.

4. An ESD-protecting circuit according to claim 1, wherein the conductive line is formed by splitting a single conductive line at a part connected to the terminal pad.

5. An ESD-protecting circuit, connected between a terminal pad and an internal circuit formed in an LSI, comprising:

a first conductive layer;

a first conductive line that is part of the first conductive layer;

a second conductive layer formed above the first conductive layer;

a second conductive line that is part of the second conductive layer;

first and second protecting elements, connected to the first and second conductive lines, respectively; and first and second resistive elements formed on the first and second conductive lines, respectively, wherein the first and second conductive lines are connected to the terminal pad so that the first and second resistive elements have equal resistive values.

6. An ESD-protecting circuit according to claim 5, further comprising:

third and fourth conductive lines, connected to the first and second conductive lines, respectively;

third and fourth protecting elements, connected to the third and fourth conductive lines, respectively; and third and fourth resistive elements formed on the third and fourth conductive lines, respectively, wherein the third and fourth conductive lines are other parts of the first and second conductive layers, respectively.

7. An ESD-protecting circuit according to claim 5, further comprising:

third and fourth conductive lines, connected to the terminal pad;

third and fourth protecting elements, connected to the third and fourth conductive lines, respectively; and third and fourth resistive elements formed on the third and fourth conductive lines, respectively, wherein the third and fourth conductive lines are other parts of the first and second conductive layers, respectively.

8. An ESD-protecting circuit according to claim 1, wherein the internal circuit comprises an I/O buffer, connected to the ESD-protecting circuit.

9. An ESD-protecting circuit according to claim 1, wherein the terminal pad comprises at least one of a power-supply terminal and a ground terminal, and the ESD-protecting circuit is connected between the terminal pad and a power-supply.

10. An LSI, comprising:

an I/O terminal pad connected to an external circuit;

an internal circuit, comprising an I/O buffer; and an ESD-protecting circuit, connected between the I/O terminal pad and the I/O buffer, wherein the ESD-protecting circuit comprises a conductive line having a first end and a second end, the first end being connected to the I/O terminal pad, first and second protecting elements, connected to the second end of the conductive line, and first and second resistive elements provided in the conductive line, wherein the conductive line has a slit that divides the conductive line so that the first and second resistive elements have equal resistive values.

11. An LSI according to claim 10, wherein the first and second protecting elements are MOS transistors.

12. An LSI according to claim 10, wherein the first and second protecting elements are diodes.

13. An LSI according to claim 10, wherein the first conductive line is formed by splitting a single conductive line at a part connected to the I/O terminal pad.

14. An LSI, comprising:

a power-supply terminal;

a ground terminal;

a power-supply line connected between the power-supply terminal and the ground terminal;

an internal circuit, connected to the power-supply line; and an ESD-protecting circuit connected on the power-supply line, wherein the ESD-protecting circuit comprises a conductive line having first and second ends, the first end being connected to a power supply terminal pad, first and second protecting elements, connected to the second end of the conductive line, and first and second resistive elements provided in the conductive line, wherein the conductive line has a slit that divides the conductive line so that the first and second resistive elements have equal resistive value.

15. An LSI according to claim 14, wherein the first and second protecting elements are MOS transistors.

16. An LSI according to claim 14, wherein the first and second protecting elements are diodes.

17. An LSI according to claim 14, wherein the conductive line is formed by splitting a single conductive line at a part connected to the power supply terminal pad.

18. An LSI, comprising:

an I/O terminal pad connected to an external circuit;

a power-supply terminal;

a ground terminal;

a power-supply line having supply lines respectively connected to the power-supply terminal and the ground terminal;

an internal circuit, which comprises an I/O buffer and is connected to the power-supply line;

a first ESD-protecting circuit, connected between the I/O terminal pad and the I/O buffer; and a second ESD-protecting circuit connected to the power-supply line, wherein each of the first and second ESD-protecting circuits respectively comprise a conductive line having a first end and a second end, whereby in the first ESD-protecting circuit the first end of the conductive line is connected to the I/O terminal pad, and whereby in the second ESD-protecting circuit the first end of the conductive line is connected to the supply line that is connected to the power-supply terminal, first and second protecting elements, connected to the second end of the conductive line, and first and second resistive elements provided in the conductive line, wherein the conductive line has a slit that divides the conductive line so that the first and second resistive elements have equal resistive value.

19. An LSI according to claim 18, wherein the first and second protecting elements are MOS transistors.

20. An LSI according to claim 18, wherein the first and second protecting elements are diodes.

21. An LSI according to claim 18, wherein the conductive line is formed by splitting a respective single conductive line at a part connected to the I/O terminal pad for the first ESD-protecting circuit and at a part connected to the supply line that is connected to the power-supply terminal for the second ESD-protecting circuit.

22. An ESD-protecting circuit according to claim 5, wherein the first and second protecting elements are MOS transistors.

23. An ESD-protecting circuit according to claim 5, wherein the first and second protecting elements are diodes.

* * * * *